(12) United States Patent
Twitto

(10) Patent No.: US 10,769,064 B1
(45) Date of Patent: Sep. 8, 2020

(54) METHOD FOR RETRIEVING KEY VALUE PAIRS AND GROUPS OF KEY VALUE PAIRS

(71) Applicant: Pliops Ltd., Tel Aviv (IL)

(72) Inventor: Moshe Twitto, Givat Shmuel (IL)

(73) Assignee: Pliops Ltd, Tel Aviv (IL)

( * ) Notice: Subject to any disclaimer, the term of this patent is extended or adjusted under 35 U.S.C. 154(b) by 0 days.

(21) Appl. No.: 16/226,641

(22) Filed: Dec. 20, 2018

Related U.S. Application Data

(60) Provisional application No. 62/607,936, filed on Dec. 20, 2017.

(51) Int. Cl.
  *G06F 12/06* (2006.01)
(52) U.S. Cl.
  CPC .. *G06F 12/0692* (2013.01); *G06F 2212/1008* (2013.01)
(58) Field of Classification Search
  None
  See application file for complete search history.

(56) References Cited

U.S. PATENT DOCUMENTS

| | | | |
|---|---|---|---|
| 5,559,956 A | 9/1996 | Sukegawa | |
| 5,598,370 A | 1/1997 | Niijima | |
| 6,377,500 B1 | 4/2002 | Fujimoto | |
| 6,684,289 B1 | 1/2004 | Gonzalez | |
| 7,171,513 B2 | 1/2007 | Gonzalez | |
| 10,303,382 B1 * | 5/2019 | Chu | G06F 3/0629 |
| 2017/0139610 A1 * | 5/2017 | Choi | G06F 12/0873 |
| 2018/0089074 A1 * | 3/2018 | Li | G06F 12/0238 |

OTHER PUBLICATIONS

G-Store: A Scalable Data Store for Transactional Multi key Access in the Cloud; Sudipto Das, Divyakant Agrawal, Amr El Abbadi; Department of Computer Science University of California, Santa Barbara, Jun. 2010 (Year: 2010).*
Outsourcing Multi-Version Key-Value Stores with Verifiable Data Freshness; Yuzhe Tang, Ling Liu, Ting Wang, Xin Hu, Reiner Sailer, Peter Pietzuch; ICDE Conference 2014 (Year: 2014).*

* cited by examiner

*Primary Examiner* — Michael Alsip
(74) *Attorney, Agent, or Firm* — Reches Patent

(57) ABSTRACT

A method for accessing a key-value pair stored in a SSD memory, the method may include receiving, by a SSD memory controller, an input key; applying a first hash function on an input key to provide a first address; reading, using the first address, an indicator that indicates whether (a) the input key is associated with a group of key-value pairs or whether (b) the input key is associated only with the key-value pair; retrieving, from the SSD memory, the values of the group associated with the input key, and extracting the value of the key-value pair, when the indicator indicates that the input key is associated with the group; and retrieving, from the SSD memory, a value of a key-value pair, when the indicator indicates that the input key is associated with the key-value pair.

20 Claims, 9 Drawing Sheets

METHOD FOR RETRIEVING KEY VALUE PAIRS AND GROUPS OF KEY VALUE PAIRS

CROSS REFERENCE

This application claims priority from U.S. provisional patent Ser. No. 62/607,936 filing date Dec. 20, 2017.

BACKGROUND

Key-value solid state drive (SSD) provides key-value (KV) interface to the user, with native commands such as get(key, &value) put(key, value), delete(key) etc'. The drive manages by itself the allocation of KV pairs into physical addresses. This offloads that task from the host, and remove redundant mapping and computations.

As the SSD memory controller is responsible to the data allocation and retrieval, it must maintain some sort of index to point to the specific location of each KV pair. In order to have low latency response to get commands it is desirable that all the index will resides in random access memory (RAM) such as but not limited to a dynamic RAM (DRAM).

However, while the host generally has access to a large amount of DRAM, the memory controller inside the SSD has access to a limited amount of DRAM (usually $\frac{1}{1000}$ of the storage size). As the number of KV pairs increases (or put equivalently, the average size of a KV pair decreases), the required amount of DRAM increases, and the internal memory may not be enough to accommodate the index table. This will result in performance deterioration.

There is a need to overcome this problem with only mild increase in host computational requirements.

SUMMARY

There may be provided systems, methods and a non-transitory computer readable media.

There may be provided a method for accessing a key-value pair that may be stored in a solid-state drive (SSD) memory, the method may include receiving, by a SSD memory controller, an input key; applying a first hash function on an input key to provide a first address; reading, using the first address, an indicator that indicates whether (a) the input key may be associated with a group (of more than one) of key-value pairs or whether (b) the input key may be associated only with the key-value pair; retrieving, from the SSD memory, the values of the group associated with the input key, and extracting the value of the key-value pair, when the indicator indicates that the input key may be associated with the group; and retrieving, from the SSD memory, a value of a key-value pair, when the indicator indicates that the input key may be associated with the key-value pair.

The indicator may be a binary indicator, and wherein the reading may include using the first address to access at least one entry of a binary table of indicators that has -bit long entries.

The retrieving, from the SSD, of the values of the group may include applying a second hush function on the first address to provide a second address; and retrieving the values of the group using a group key stored in the second address.

The retrieving, from the SSD memory, of the values of the group may include reading, using the second address, at least one entry of a second table that may store pointers to a group key table that may store group keys for retrieval of groups of key value pairs.

The retrieving, from the SSD memory, of the values of the group may include reading, using the second address, at least one entry of a group key table that may store group keys for retrieval of groups of key value pairs.

The retrieving, from the SSD memory, of the values of the group may include searching a tree of group keys.

The retrieving, from the SSD memory, of the values of the group may include searching a tree of pointers that point to group keys for retrieval of groups of key value pairs.

The method may include reading, using the first address, an entry of a hybrid table that may store the indicator and stores a pointer for retrieving a group key table that may store group keys for retrieval of groups of key value pairs, when the indicator indicates that the input key may be associated with the group.

The method where the hybrid table may include the group keys.

There may be provided a non-transitory computer readable medium that may store instructions that once executed by a system that may include a solid-state drive (SSD) memory controller, causes the system to perform the steps of receiving, by the SSD memory controller, an input key; applying, by the SSD memory controller, a first hash function on an input key to provide a first address; reading, using the first address, an indicator that indicates whether (a) the input key may be associated with a group of key-value pairs or whether (b) the input key may be associated only with the key-value pair; retrieving, from a SSD memory, the values of the group associated with the input key, and extracting the value of the key-value pair, when the indicator indicates that the input key may be associated with the group; and retrieving, from the SSD memory, a value of a key-value pair, when the indicator indicates that the input key may be associated with the key-value pair.

The indicator may be a binary indicator, and wherein the reading may include using the first address to access at least one entry of a binary table of indicators that has -bit long entries.

The retrieving, from the SSD, of the values of the group may include applying a second hush function on the first address to provide a second address; and retrieving the values of the group using a group key stored in the second address.

The retrieving, from the SSD memory, of the values of the group may include reading, using the second address, at least one entry of a second table that may store pointers to a group key table that may store group keys for retrieval of groups of key value pairs.

The retrieving, from the SSD memory, of the values of the group may include reading, using the second address, at least one entry of a group key table that may store group keys for retrieval of groups of key value pairs.

The retrieving, from the SSD memory, of the values of the group may include searching a tree of group keys.

The retrieving, from the SSD memory, of the values of the group may include searching a tree of pointers that point to group keys for retrieval of groups of key value pairs.

The non-transitory computer readable medium that may store instructions for reading, using the first address, an entry of a hybrid table that may store the indicator and stores a pointer for retrieving a group key table that may store group keys for retrieval of groups of key value pairs, when the indicator indicates that the input key may be associated with the group.

There may be provided a solid-state drive (SSD) memory controller, that may include at least one circuit that may be configured to receive an input key; apply a first hash function on an input key to provide a first address; and read, using the first address, an indicator that indicates whether (a) the input key may be associated with a group of key-value pairs or whether (b) the input key may be associated only with the key-value pair; retrieve, from a SSD memory, the values of the group associated with the input key and extract the value of the key-value pair, when the indicator indicates that the input key may be associated with the group; and retrieve, from the SSD memory, a value of a key-value pair, when the indicator indicates that the input key may be associated with the key-value pair.

The indicator may be a binary indicator, and wherein the at least one circuit may be configured to read the indicator by using the first address to access at least one entry of a binary table of indicators that has -bit long entries.

The at least one circuit may be configured to retrieve, from the SSD, of the values of the group by applying a second hush function on the first address to provide a second address; and retrieve the values of the group using a group key stored in the second address.

The at least one circuit may be configured to retrieve, from the SSD memory, of the values of the group by reading, using the second address, at least one entry of a second table that may store pointers to a group key table that may store group keys for retrieval of groups of key value pairs.

The at least one circuit may be configured to retrieve, from the SSD memory, of the values of the group by reading, using the second address, at least one entry of a group key table that may store group keys for retrieval of groups of key value pairs.

The at least one circuit may be configured to retrieve, from the SSD memory, of the values of the group by searching a tree of group keys.

The at least one circuit may be configured to retrieve, from the SSD memory, of the values of the group by searching a tree of pointers that point to group keys for retrieval of groups of key value pairs.

The at least one circuit may be configured to read, using the first address, an entry of a hybrid table that may store the indicator and stores a pointer for retrieving a group key table that may store group keys for retrieval of groups of key value pairs, when the indicator indicates that the input key may be associated with the group.

There may be provided a method for writing a key-value pair to a solid-state drive (SSD) memory, the method may include receiving, by an SSD memory controller, a put command for writing a key-value pair to the SSD memory; determining whether the key-value pair may be small, wherein the key value pair may be small when a size of the key-value pair may be below a first size threshold; wherein when the key-value pair may be small then (a) associating the put command to a group of put commands, and (b) storing the put command in a non-volatile buffer of a volatile memory of the SSD memory controller; wherein the non-volatile buffer may be allocated to the group of put commands; monitoring an aggregate size of put commands of the group; wherein when the aggregate size of the put commands of the group exceeds a second size threshold then storing pair-key pairs of the put commands of the group in the SSD memory.

The method may include generating, by the SSD memory controller, a group key that may be associated with the values of the group.

The method may include generating, by the SSD memory, a group key that may be associated with the values of the group.

The method may include assigning to each put command of the group order metadata that may be indicative of an order of the put command in the group.

The method may include sending, by the SSD controller, a delete command for deleting the put commands of the group after all the put commands of the group may be invalid.

The method may include monitoring a state of the put commands of the group, wherein when a percentage of valid put commands of the group may be below a validity threshold then (a) writing the valid put commands to a location that differs from the non-volatile buffer and (b) sending, by the SSD controller, a delete command for deleting the group.

There may be provided a non-transitory computer readable medium that may store instructions that once executed by a solid-state drive (SSD) memory controller, causes the SSD memory controller to perform the steps of receiving a put command for writing a key-value pair to the SSD memory; determining whether the key-value pair may be small, wherein the key value pair may be small when a size of the key-value pair may be below a first size threshold; wherein when the key-value pair may be small then (a) associating the put command to a group of put commands, and (b) storing the put command in a non-volatile buffer of a volatile memory of the SSD memory controller; wherein the non-volatile buffer may be allocated to the group of put commands; monitoring an aggregate size of put commands of the group; wherein when the aggregate size of the put commands of the group exceeds a second size threshold then storing pair-key pairs of the put commands of the group in the SSD memory.

The non-transitory computer readable medium that may store instructions for generating, by the SSD memory controller, a group key that may be associated with the values of the group.

The non-transitory computer readable medium that may store instructions for generating, by the SSD memory, a group key that may be associated with the values of the group.

The non-transitory computer readable medium that may store instructions for assigning to each put command of the group order metadata that may be indicative of an order of the put command in the group.

The non-transitory computer readable medium that may store instructions for sending a delete command for deleting the put commands of the group after all the put commands of the group may be invalid.

The non-transitory computer readable medium that may store instructions for monitoring a state of the put commands of the group, wherein when a percentage of valid put commands of the group may be below a validity threshold then (a) writing the valid put commands to a location that differs from the non-volatile buffer and (b) sending a delete command for deleting the group.

A solid-state drive (SSD) memory controller, that may include at least one circuit that may be configured to receive a put command for writing a key-value pair to the SSD memory; determine whether the key-value pair may be small, wherein the key value pair may be small when a size of the key-value pair may be below a first size threshold; wherein when the key-value pair may be small then (a) associate the put command to a group of put commands, and (b) store the put command in a non-volatile buffer of a volatile memory of the SSD memory controller; wherein the non-volatile buffer may be allocated to the group of put commands; monitor an aggregate size of put commands of the group; and wherein when the aggregate size of the put commands of the group exceeds a second size threshold then store pair-key pairs of the put commands of the group in the SSD memory.

The at least one circuit may be configured to generate a group key that may be associated with the values of the group.

The at least one circuit may be configured to assign to each put command of the group order metadata that may be indicative of an order of the put command in the group.

the at least one circuit may be configured to send a delete command for deleting the put commands of the group after all the put commands of the group may be invalid.

the at least one circuit may be configured to monitor a state of the put commands of the group, wherein when a percentage of valid put commands of the group may be below a validity threshold then (a) write the valid put commands to a location that differs from the non-volatile buffer and (b) send a delete command for deleting the group.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
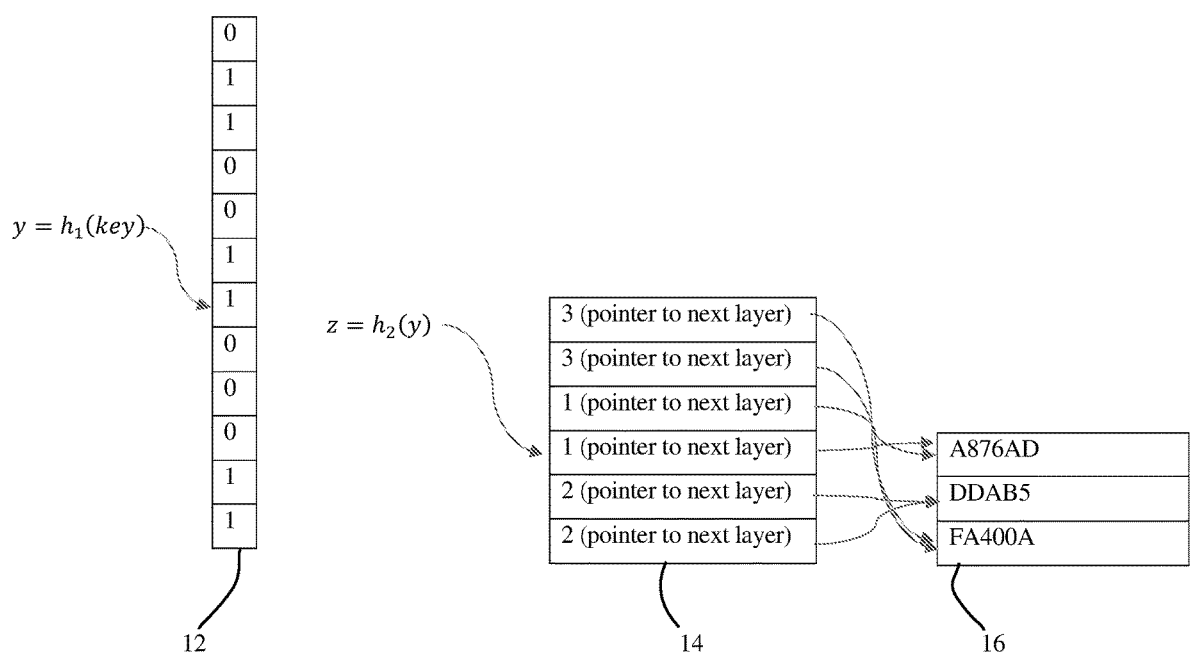
FIG. 1 illustrates an example of a mapping.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that once executed by a computer result in the execution of the method.

The system for which we demonstrate the method may be a host computer system which is equipped with a plurality of processors and plurality of memory channel. In each of the memory channels there is a plurality of memory devices (e.g., DIMMs). The host computer system communicates with plurality of KV SSD drives over some interface protocol, commonly PCIe or ethernet.

Each SSD drive is composed of NAND flash units, a controller, and optionally DRAM units.

The NAND flash units are arranged in channels, where each channel is composed of several ways (NAND dies). All dies in a channel share the same bus to the controller. Each die is constituted from a plurality of blocks, where each block is composed of multiple word-lines (WLs). Each WL is composed of plurality of cells, and each cell contains several bits of information. Devices that have a single bit per cell are called SLC (single level cell), while devices that contains 2, 3 and 4 bits per cells are referred to as MLC (multi level cell), TLC (three level cell) and QLC (four level cell), respectively. Each level of bits in a WL is called a page. Typically, one page can store about 18 KB, and each block have typically 64-256 WLs. While it is possible to read any page (or part of it) from a NAND die, programming is possible only for erased blocks, and it is done in a predefined order.

Thus, updating a page in-place is impossible. One must first copy all valid information from the block to an already erased block, possibly together with the updated page value, and then the block can be erased. After erase operation is completed, the block is ready for programming.

The described process is referred to as "garbage collection", and is generally responsible for most of the actual programming to the device. An important figure of merit for SSDs is the ratio between number of actual ("physical") bytes written to the device to the number of logical bytes sent by the host (user).

This number is referred to as write-amplification (WA), and it obviously affect overall write performance. In order to mitigate WA, the SSD is over-provisioned with extra blocks. It can be shown, that with higher over-provisioning (OP), the WA is lower. For example, for 100% OP, the WA can be 1—that is, there are no excessive writes per logical write. Typical numbers for OP ranges between 7% to 40%, where high-end devices which are designed to meet the strict requirements of data-centers and enterprises storage systems come with higher OP, and low-end, consumer-grade SSDs are with low OP.

The method is related to the field of storage devices whose interface is key-value. With this interface, the user presents a key and accompanied value to store, and to retrieve the value it presents the associated key. Both key and value are variable-length.

The memory controller implements the following tasks: (1) Assignment of newly arrived put commands into specific physical address, (2) maintenance of some sort of data structure that enables retrieval of data (i.e., serves get commands). Examples of such data structures includes hash tables B trees and log structured merge (LSM) trees. (3)

maintenance operations for the NAND devices which includes free space reclamation (aka garbage collection) and wear leveling.

We note that there are some data structures that define solely define the indexing method, while there are data structures that define both (1) and (2), for example Btree, and there are some data structures that define all the three tasks above (except wear leveling) such as LSM tree. The disclosed method is beneficial to the system regardless to the underline data structure implementation. In the following we demonstrates the embodiment of the invention to hash table based indexing, but it could be trivially extended to other data structures by any person who is skilled in the art. All the numbers and procedures are for explanatory reasons and should not limit the scope of the invention.

Assume that the physical NAND flash of the SSD is of size 1 GB, if the OP is 25% then the usable space is 800 MB. We assume that the incoming KV pairs are written sequentially to the NAND blocks, until the entire 1 GB storage is full (with 800 MB of data). Then, garbage collection (GB) process is initiated to reclaim free space (by removing deleted (or overwritten) KV pairs).

Simple Hash table data structure hash the keys of the incoming KV pair and stores a pointer to the physical location of the stored KV pair in the NAND, at the address generated by the hash function. For example, if key=100 and h(100)=10, then at bin 10 of the hash table the memory controller will store the pointer to the physical location of the KV pair in the NAND. In case of collision, that is, if a value is already stored at bin 10, a free bin from a free bin list will be used to store the pointer of the location of key 100, and the original bin 10 will contain another pointer to the location of the new pointer in the RAM (that is, each bin may be the head of a linked list).

The described collision resolution method is the simplest one, and there are numerous other methods.

If we want to get the correct location of the data with a single NAND read, we must add the key to the pointer, so we can associate each pointer in the linked list its key. Alternatively, only part of the bits of the key can be stored which enable correct retrieval in one NAND access with high probability.

Assume that we need pointer resolution of 64B, then the size of the pointer to the NAND is log 2(1 GB/64)=24 bits. Keep in mind that we also need to store a pointer to the next element in the linked list ("next pointer") which requires another 2B. If we want to store 3B of the key, we end up with 8B per key. The rule-of-thumb of size of DRAM in SSD is $\frac{1}{1000}$ of the storage. Hence in the above example we assume that the SSD has 1 MB DRAM.

If each KV pair required 8B, then we can accommodate only 128K KV pair without DRAM overflow. In case of DRAM overflow, the conventional art is to allocate linked-list elements from the NAND. In such case, any reference to a KV pair whose pointer resides in NAND will require 2 NAND accesses, which will double the latency. Put in other words, we can store KV pairs with minimal average size of 800 MB/128K=6.4 KB. If the average size of KV pair is less than 6.4 KB, then part of the table need to be stored in the NAND devices, which are several orders of magnitude slower than DRAM. To improve performance, several caching algorithms may be employed, but as the average KV pair size keep to decrease performance is deemed to deteriorates significantly.

According to our method, the host maintain a threshold value T (which may be zero according to some embodiments), and a saturation value S. While receiving put commands of size less than T, the host defer those commands to a buffer.

After collecting KV pair with aggregated size S, the program on the host computer wrap all those KV pair under a unique key we refer to this key as storage key. Unique key can be generated using PRNG with high enough number of bits, and send the KV drive a single put command, where the value is just the concatenation of all KV pairs in the buffer (whose total size is at least S).

Hence, the average size of the KV pairs that exposed to the KV drive is large enough so the drive can accommodate all pointers inside the DRAM. In order to enable retrieval of data, the host program need to generate a local mapping on the host computer system that maps keys to storage keys. As the amount of DRAM at the host computer system is generally very high, the added mapping poses no practical problem. The method is described in מקור ההפניה לא נמצא. שגיאה!.

שגיאה! מקור ההפניה לא נמצא. illustrates a proposed lightweight mapping to be maintained at the host size. The mapping is composed of three layers. The first layer is a hash table with binary values, where 0 indicates that the storage key is identical to the original key, and 1 indicates that storage key is not identical. If a key is not identical, then a second hash function which is operates on the results of the first hash function (or the location of the corresponding '1' in the first hash table) is used to point to a second hash table whose values are pointers to a third region which contains the storage keys. Some variants can be apply to the proposed mapping. First, if the amount of small KV pairs is large (higher than 50% for example), the main hash table may contain the pointers to the third layer.

According to this variation only two layers exists, as depicted in ההפניה לא נמצא. שגיאה! מקור.

If S/T is not very high, then the third layer may be merged to the second, as depicted in שגיאה! מקור ההפניה לא נמצא.

Finally, if both S/T is small and there is a high percentage of smaller than T KV pairs than a simple hash table whose value is the new storage key or 0 (which again indicates no change to original key) is enough. מקור ההפניה לא נמצא. שגיאה! illustrates the final modification. As is clear now, the first version uses the smallest amount of DRAM, especially when S/T is large and only a relatively small percentage of the KV pair are smaller than T.

In the figures and explanation above a simple hash table was assumed. However, more sophisticated hash tables (coocko hash, hop-scotch, robin-hood hash, etc') can be used as a building block in each of the aforementioned hash tables. Although not specifically written for clarity reasons, each bin must contain some bits for key identification, as is well known in the art.

Figure 7:
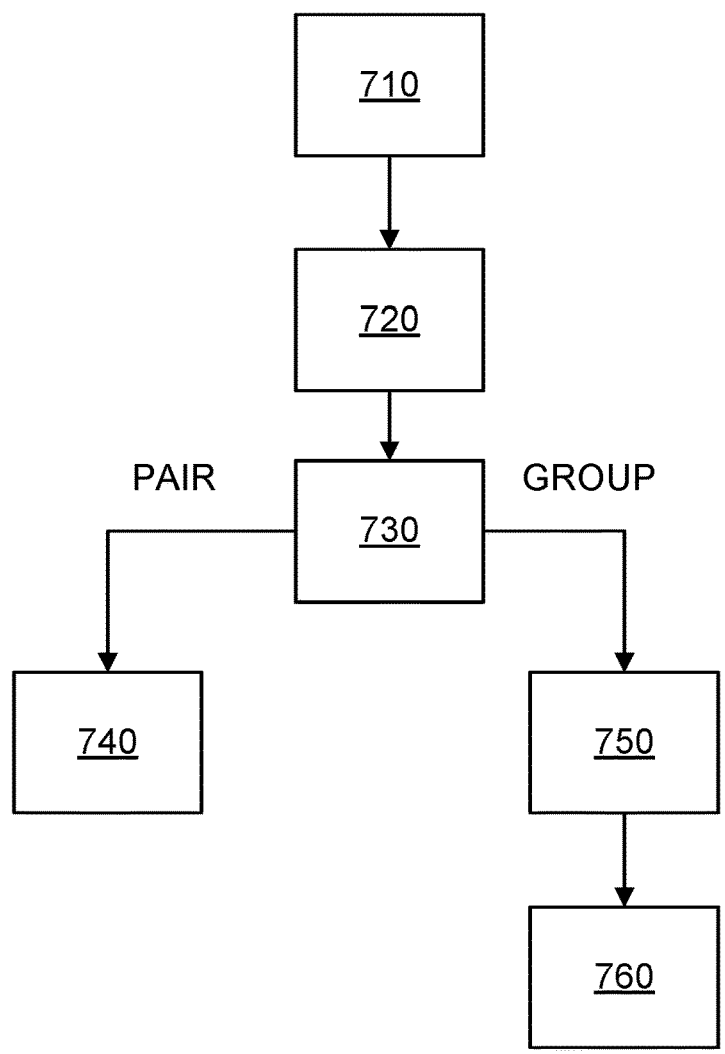
FIG. 7 illustrates an example of a method.

FIG. 7 illustrates method 700 for accessing a key-value pair that is stored in a solid-state drive (SSD) memory.

Method 700 may start by step 710 of receiving, by a SSD memory controller, an input key.

Step 710 may be followed by step 720 of applying a first hash function on an input key to provide a first address.

Step 720 may be followed by step 730 of reading, using the first address, an indicator that indicates whether (a) the input key is associated with a group of key-value pairs or whether (b) the input key is associated only with the key-value pair.

If condition (b) is fulfilled—step 730 is followed by step 740.

If condition (a) is fulfilled—step 730 is followed by step 750.

Step 740 includes retrieving, from the SSD memory, a value of a key-value pair, when the indicator indicates that the input key is associated with the key-value pair key. The retrieval involves using a storage key associated with the key-value pair.

Step 750 includes retrieving, from the SSD memory, the values of the group associated with the input key.

Step 750 is followed by step 760 of extracting the value of the key-value pair.

The indicator may be a binary indicator, and wherein the reading may include using the first address to access at least one entry of a binary table of indicators that has 1-bit long entries. Such a binary table is denoted 12 in various figures.

Step 750 may include applying a second hush function on the first address to provide a second address, and retrieving the values of the group using a group key stored in the second address. In this case the group key is a storage key sent to the SSD memory for retrieving the value of the key value pair.

The retrieving, from the SSD memory, of the values of the group may include reading, using the second address, at least one entry of a second table that stores pointers to a group key table that stores group keys for retrieval of groups of key value pairs. Second table is denoted 14 and group key table is denoted 16 in various tables.

The retrieving, from the SSD memory, of the values of the group may include reading, using the second address, at least one entry of a group key table that stores group keys for retrieval of groups of key value pairs.

The retrieving, from the SSD memory, of the values of the group may include searching a tree of group keys.

The retrieving, from the SSD memory, of the values of the group may include searching a tree of pointers that point to group keys for retrieval of groups of key value pairs.

Step 750 may include reading, using the first address, an entry of a hybrid table that stores the indicator and stores a pointer for retrieving a group key table that stores group keys for retrieval of groups of key value pairs, when the indicator indicates that the input key is associated with the group. The hybrid table is denoted 20 in some figures.

The hybrid table may include the group keys.

Yet another space efficient method to store the mapping information is using trees. See for example FIG. 6. Only the small KV pair which were chosen to be grouped in a wrapper KV pair are stores in a tree structure. Upon get command, this tree is search to have the storage key. If the key was not found then the SSD is queried using the original key. Each data element in the tree contains the key (or a partial hashed version of it to save space), along with the its associated storage key. Again, if S/T is large, only a pointer to the storage key is stores at the tree and a two-level data structure is maintained. The tree may be a B-tree in order to reduce the number of DRAM accesses. An example of binary balanced tree is illustrated in שגיאה! מקור ההפניה לא נמצא.

Some storage systems require synchronous put commands. That is, new put commands are blocked until the persistent layer acknowledges that the data in the previous command was written to a persistent storage. The above method clearly cannot perform in such environment, as new commands will be impeded once one small command is put into the buffer.

One solution to this problem is to use log file. In parallel to filling buffer with small commands, an on-disc log file is opened and all the deferred commands are written to it. Upon power failure, the log file is scanned to reconstruct the state of the storage system prior to power fail. Hence, the host program can acknowledge the user of command completion and the process that is illustrates in לא נמצא. שגיאה! מקור ההפניה can continue. The process 30 includes steps 31, 32, 33, 34, 35, 36 and 37.

The above method may reduce the write throughput of such storage systems, as the put commands whose size is smaller than T must be written first to a log file for persistency, and then again after they wrapped in a single storage key. Hence, small command will suffer from write amplification of 2. If the ratio of small commands is high, then overall performance is compromised.

Figure 9:
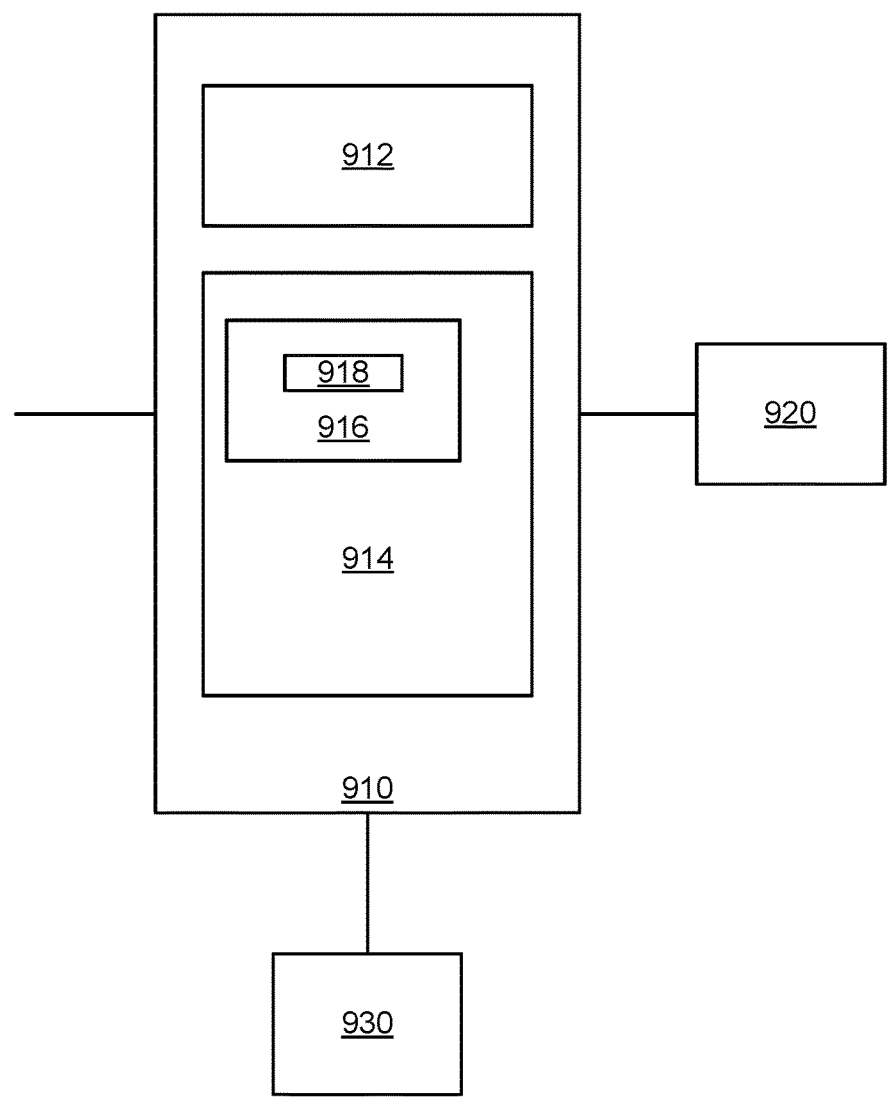
FIG. 9 illustrates a system that includes a SSD memory controller, a SSD memory and a RAM memory.

Another embodiment which solves both synchronicity and performance is depicted herein. While receiving put commands of size less than T, the host defer those commands to a non-volatile region in the SSD internal DRAM, instead to host DRAM. (for example see FIG. 9—the SSD memory controller 910 includes a processor 912, a DRAM 914, and a non-volatile part 916 of the DRAM that may store one or more buffers such as buffer 918. The SSD memory controller is coupled to SSD memory 920 and DRAM 930).

Generally, non-volatility is achieved by on-board power source (super capacitors, for example). The host may use special put command to the KV SSD to indicate that the SSD should not keep the command in main storage, but in temporary non-volatile DRAM of the SSD. That command may also contain a counter to indicate the commands order so in case of packet loss the KV SSD may notify the host for retransmission. It can also contain buffer number, to manage several buffers concurrently. After a buffer on the SSD is of size S, the host may send a "commit" command with the buffer id and storage key, to indicate the KV SSD that it can store the buffer under the key name in the main storage. Alternatively, the commit command may contain no storage key, and the KV SSD will compute its own storage key and send it to the host along with the command completion message.

During the life time of a storage/database system, delete commands also present. Hence, some of the small KV which were encapsulated into a single storage key are no longer valid.

One simple but not space efficient method is to send delete command to the KV SSD just after all KV pair inside one storage key are invalid. This method has excellent write throughput, but its space implications are significant.

If the OP is r, then the probability that all KV pair inside a randomly chosen wrapper KV are invalid is roughly about $$\left(\frac{r}{1+r}\right)^{S/T}.$$

For example, if r=25%, S/T=4, then only 0.16% of the wrapper KV are totally empty. Even at OP of 100% just about 6% of the wrapper KV are completely invalid.

Hence, we suggest to implement a KV pair reclamation process as follows.

For each wrapper KV pair maintain a record with the percentage of it being valid. Those records can be stored in heap structure, so access to the least full KV is achieved in 1 DRAM read. While the overall space utilization drops below some threshold U, the least full wrapper KV is read from the KV SSD using get command. Then all valid small KV pairs are moved to the write buffer (which is elaborated above), and then a delete command is sent to the KV SSD with the storage key of the chosen KV pair.

There are two option to handle the valid, small, KV pairs which were extracted from the reclaimed wrapper KV: (1)

add them to current active buffer (either at host side or in non-volatile DRAM at SSD side) mixed with small put commands from the user. (2) dedicate a special buffer for such KV pairs. That is, all small KV pairs that were reclaimed from chosen wrapper KV are put into same buffer, and while it is full—a new storage key is generated and a put command with this key is sent to the KV SSD. The possible advantage of the second method is that it achieves some sort of hot/cold separation, as valid KV pairs appears to be "colder", hence better put together. Another variation of the method is to use a different saturation threshold S2 for the extracted KV pair which is generally higher than S. This is because if indeed the extracted KV pairs are "colder" and rarely changed, it is more efficient to store then all in the same "blob".

Figure 8:
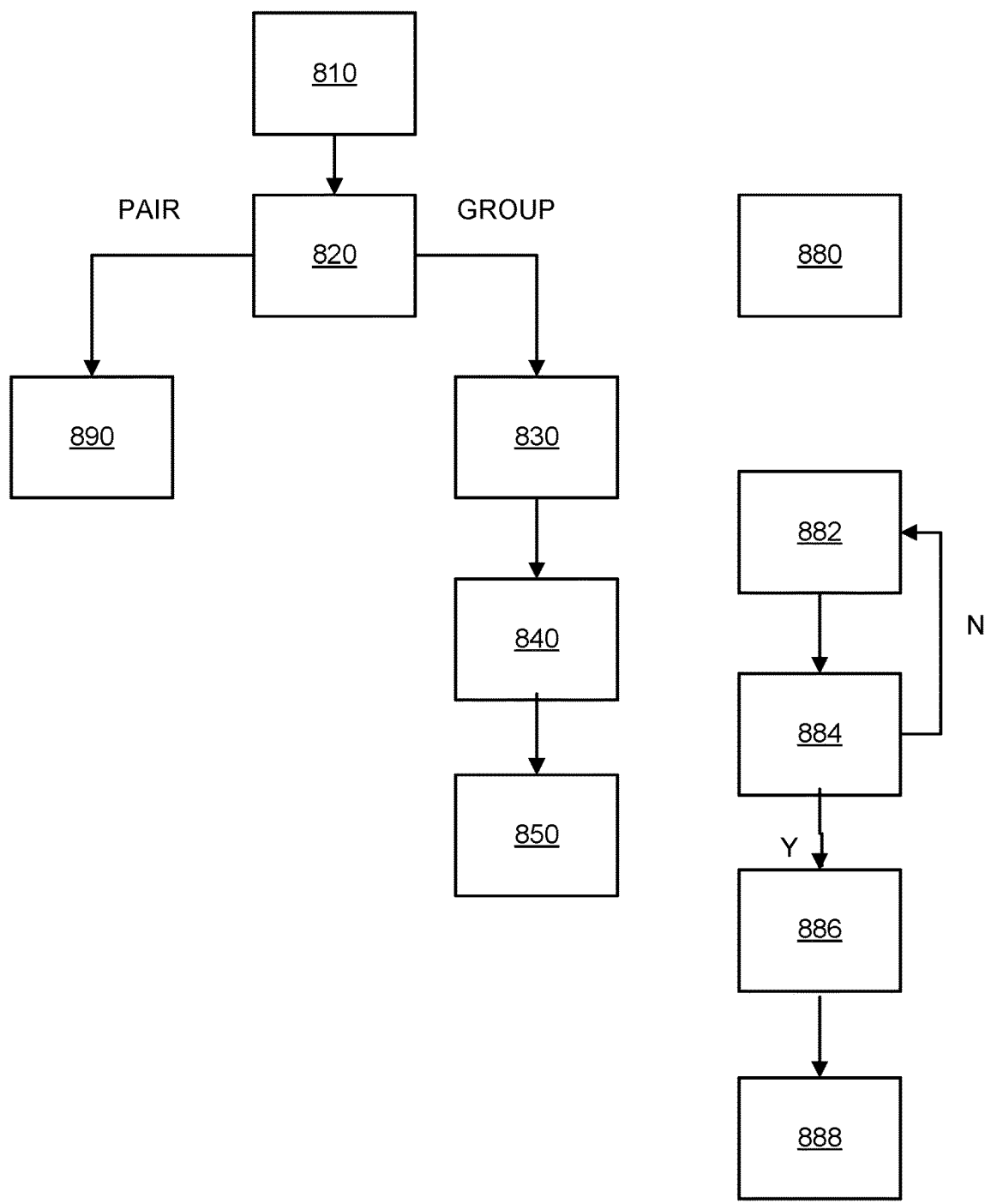
FIG. 8 illustrates an example of a method.

FIG. 8 illustrates method 800.

Method 800 starts by step 810 of receiving, by an SSD memory controller, a put command for writing a key-value pair the SSD memory.

Step 810 may be followed by step 820 of determining whether the key-value pair is small, wherein the key value pair is small when a size of the key-value pair is below a first size threshold.

When the key-value pair is not small—step 820 may be followed by step 890 of storing the key-value pain in the SSD memory. The storing may be delayed.

When the key-value pair is small—step 820 may be followed by step 830 of (a) associating the put command to a group of put commands, and (b) storing the put command in a non-volatile buffer of a volatile memory of the SSD memory controller; wherein the non-volatile buffer is allocated to the group of put commands.

Step 830 may also include generating, by the SSD memory or by the SSD memory controller, a key value that is associated with the values of the group Step 830 may be followed by receiving a new put command (step 810).

Step 830 may also be followed by step 840 of monitoring, by the SSD memory controller, an aggregate size of put commands of the group.

When the aggregate size of the put commands of the group exceeds a second size threshold then step 840 may be followed by step 850 of storing pair-key pairs of the put commands of the group in the SSD memory.

While the aggregate size of the put commands of the group does not exceeds a second size threshold—step 840 may be followed by itself.

Step 830 may also include assigning to each put command of the group order metadata that is indicative of an order of the put command in the group.

Method 800 may also includes step 880 of sending, by the SSD controller, a delete command for deleting the put commands of the group after all the put commands of the group are invalid.

Method 800 may also include:
a. Step 882 of monitoring a state of the put commands of the group.
b. Step 884 of determining whether a percentage of valid put commands of the group is below a validity threshold.
c. When the answer is positive (percentage of valid put commands of the group is below the validity threshold)—step 884 may be followed by step 886 of writing the valid put commands to a location that differs from the non-volatile buffer.
d. Step 888 of sending, by the SSD controller, a delete command for deleting the group.

Another variant of the method is to use adaptively changed threshold T and S. While the SSD is almost empty, T can be very small (even zero). While the DRAM at the SSD is exhausted, T and S can become larger. Clearly, both a-priori set and adaptive threshold may suffer from DRAM overflow in rare events. The solution is to read already-stored KV pairs and group them under the same storage key. Such dynamic method allows for controlled write amplification, while still keeping the SSD DRAM from overflow.

This application provides a significant technical improvement over the prior art—especially an improvement in computer science.

Any reference to the term "may include" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a computer program product such as non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'may include' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for accessing a key-value pair that is stored in a solid-state drive (SSD) memory, the method comprises:
   receiving, by a SSD memory controller, an input key;
   applying a first hash function on an input key to provide a first address;
   reading, using the first address, an indicator that indicates whether (a) the input key is associated with a group of key-value pairs or whether (b) the input key is associated only with the key-value pair;
   retrieving, from the SSD memory, the values of the group associated with the input key, and extracting the value of the key-value pair, when the indicator indicates that the input key is associated with the group; and
   retrieving, from the SSD memory, a value of a key-value pair, when the indicator indicates that the input key is associated with the key-value pair.

2. The method according to claim 1, wherein the indicator is a binary indicator, and wherein the reading comprises using the first address to access at least one entry of a binary table of indicators that has 1-bit long entries.

3. The method according to claim 2, wherein the retrieving, from the SSD, of the values of the group comprises applying a second hush function on the first address to provide a second address; and retrieving the values of the group using a group key stored in the second address.

4. The method according to claim 3, wherein the retrieving, from the SSD memory, of the values of the group comprises reading, using the second address, at least one entry of a second table that stores pointers to a group key table that stores group keys for retrieval of groups of key value pairs.

5. The method according to claim 3, wherein the retrieving, from the SSD memory, of the values of the group comprises reading, using the second address, at least one entry of a group key table that stores group keys for retrieval of groups of key value pairs.

6. The method according to claim 1, wherein the retrieving, from the SSD memory, of the values of the group comprises searching a tree of group keys.

7. The method according to claim 1, wherein the retrieving, from the SSD memory, of the values of the group comprises searching a tree of pointers that point to group keys for retrieval of groups of key value pairs.

8. The method according to claim 1, may include reading, using the first address, an entry of a hybrid table that stores the indicator and stores a pointer for retrieving a group key table that stores group keys for retrieval of groups of key value pairs, when the indicator indicates that the input key is associated with the group.

9. The method according to claim 8, where the hybrid table comprises the group keys.

10. A non-transitory computer readable medium that stores instructions that once executed by a system that comprises a solid-state drive (SSD) memory controller, causes the system to perform the steps of:
receiving, by the SSD memory controller, an input key;
applying, by the SSD memory controller, a first hash function on an input key to provide a first address;
reading, using the first address, an indicator that indicates whether (a) the input key is associated with a group of key-value pairs or whether (b) the input key is associated only with the key-value pair;
retrieving, from a SSD memory, the values of the group associated with the input key, and extracting the value of the key-value pair, when the indicator indicates that the input key is associated with the group; and
retrieving, from the SSD memory, a value of a key-value pair, when the indicator indicates that the input key is associated with the key-value pair.

11. The non-transitory computer readable medium according to claim 10, wherein the indicator is a binary indicator, and wherein the reading comprises using the first address to access at least one entry of a binary table of indicators that has 1-bit long entries.

12. The non-transitory computer readable medium according to claim 11, wherein the retrieving, from the SSD, of the values of the group comprises applying a second hush function on the first address to provide a second address; and retrieving the values of the group using a group key stored in the second address.

13. The non-transitory computer readable medium according to claim 12, wherein the retrieving, from the SSD memory, of the values of the group comprises reading, using the second address, at least one entry of a second table that stores pointers to a group key table that stores group keys for retrieval of groups of key value pairs.

14. The non-transitory computer readable medium according to claim 12, wherein the retrieving, from the SSD memory, of the values of the group comprises reading, using the second address, at least one entry of a group key table that stores group keys for retrieval of groups of key value pairs.

15. The non-transitory computer readable medium according to claim 10, wherein the retrieving, from the SSD memory, of the values of the group comprises searching a tree of group keys.

16. The non-transitory computer readable medium according to claim 10, wherein the retrieving, from the SSD memory, of the values of the group comprises searching a tree of pointers that point to group keys for retrieval of groups of key value pairs.

17. The non-transitory computer readable medium according to claim 10, that stores instructions for reading, using the first address, an entry of a hybrid table that stores the indicator and stores a pointer for retrieving a group key table that stores group keys for retrieval of groups of key value pairs, when the indicator indicates that the input key is associated with the group.

18. A solid-state drive (SSD) memory controller, that comprises at least one circuit that are configured to receive an input key; apply a first hash function on an input key to provide a first address; and read, using the first address, an indicator that indicates whether (a) the input key is associated with a group of key-value pairs or whether (b) the input key is associated only with the key-value pair; retrieve, from a SSD memory, the values of the group associated with the input key and extract the value of the key-value pair, when the indicator indicates that the input key is associated with the group; and retrieve, from the SSD memory, a value of a key-value pair, when the indicator indicates that the input key is associated with the key-value pair.

19. The SSD memory controller according to claim 10, wherein the indicator is a binary indicator, and wherein the at least one circuit is configured to read the indicator by using the first address to access at least one entry of a binary table of indicators that has 1-bit long entries.

20. The SSD memory controller according to claim 11, wherein the at least one circuit is configured to retrieve, from the SSD, of the values of the group by applying a second hush function on the first address to provide a second address; and retrieve the values of the group using a group key stored in the second address.

* * * * *

UNITED STATES PATENT AND TRADEMARK OFFICE
CERTIFICATE OF CORRECTION

PATENT NO. : 10,769,064 B1
APPLICATION NO. : 16/226641
DATED : September 8, 2020
INVENTOR(S) : Moshe Twitto Page 1 of 1

It is certified that error appears in the above-identified patent and that said Letters Patent is hereby corrected as shown below:

In the Specification

Figure 2:
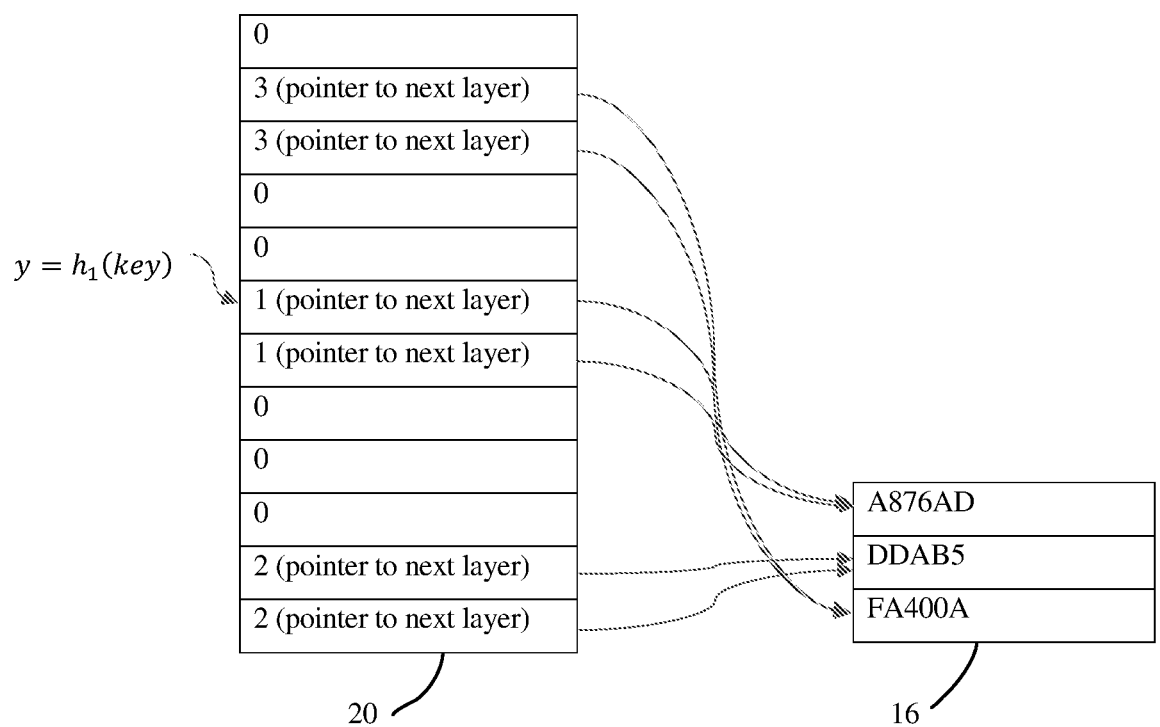
FIG. 2 illustrates an example of a mapping.
Figure 3:
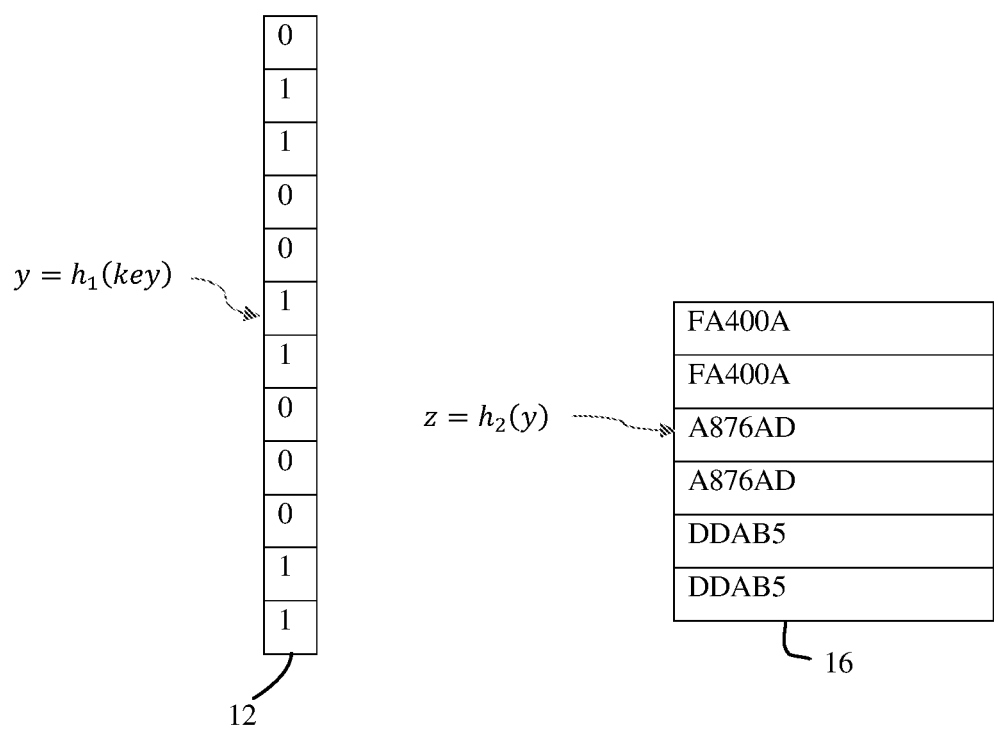
FIG. 3 illustrates an example of a mapping.
Figure 4:
FIG. 4 illustrates an example of a hybrid table.
Figure 5:
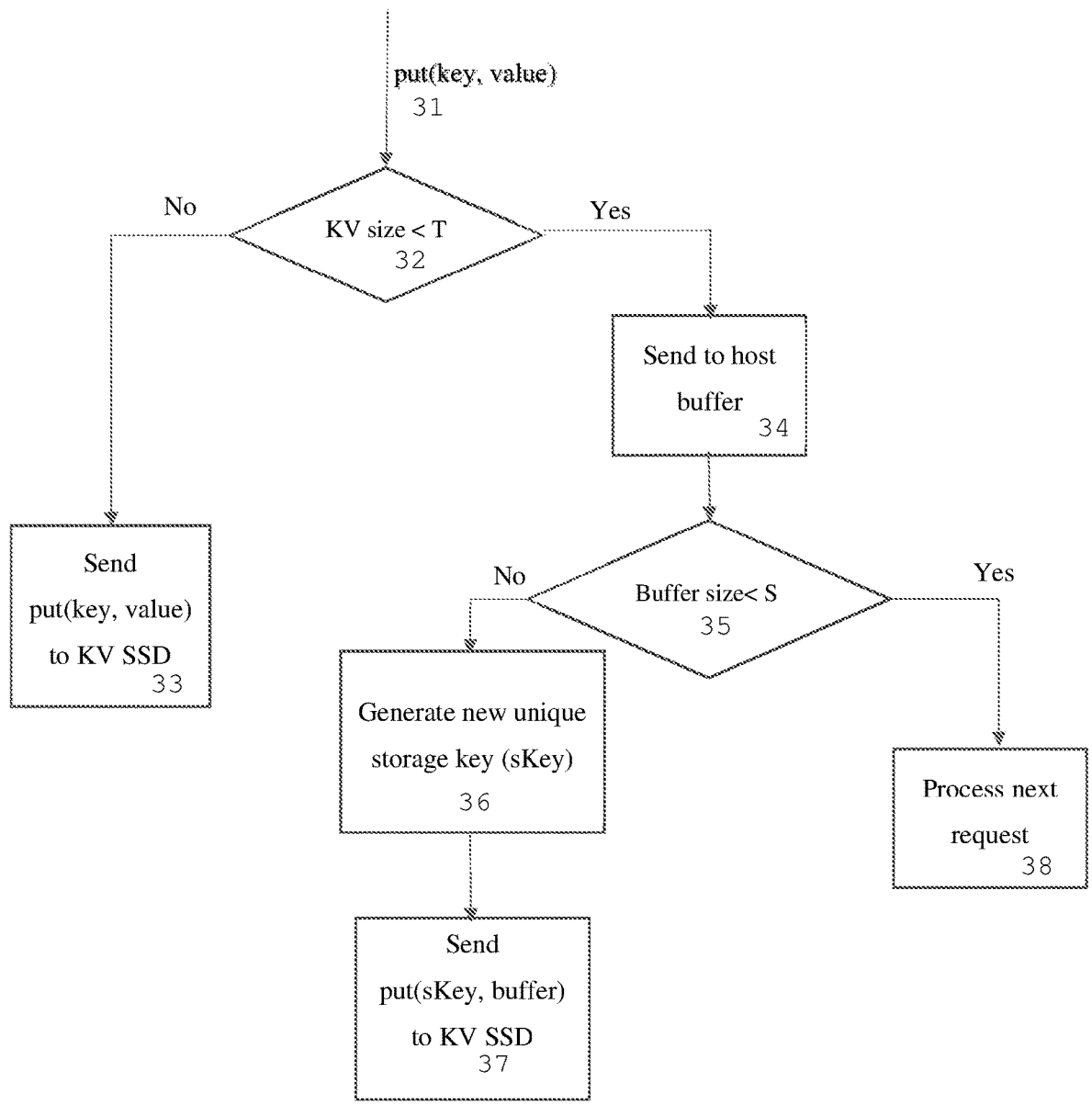
FIG. 5 illustrates an example of a method.

Column 8, Lines 18-19, delete "שגיאה! מקור ההפניה לא נמצא" and replace with --Figure 5--;
Column 8, Line 20, delete "שגיאה! מקור ההפניה לא נמצא" and replace with --Figure 1--;
Column 8, Line 35, delete "שגיאה! מקור ההפניה לא נמצא" and replace with --Figure 2--;
Column 8, Line 37, delete "שגיאה! מקור ההפניה לא נמצא" and replace with --Figure 3--; and
Column 8, Lines 41-42, delete "שגיאה! מקור ההפניה לא נמצא" and replace with --Figure 4--.

Figure 6:
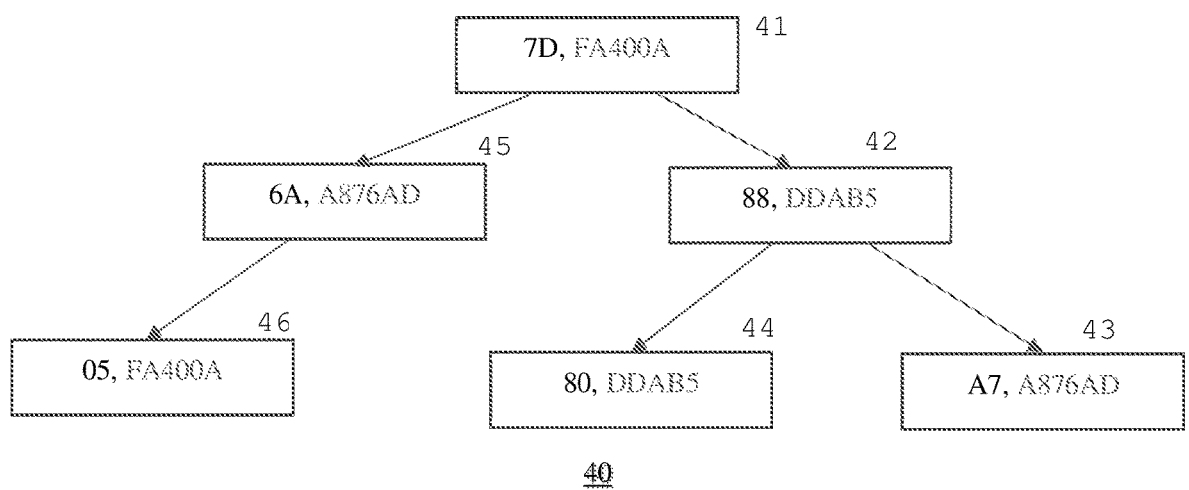
FIG. 6 illustrates a binary tree.

Column 9, Line 54, delete "שגיאה! מקור ההפניה לא נמצא" and replace with --Figure 6--.

Column 10, Lines 2-3, delete "שגיאה! מקור ההפניה לא נמצא" and replace with --Figure 5--.

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*